(12) United States Patent
Bickell et al.

(10) Patent No.: US 10,878,983 B2
(45) Date of Patent: Dec. 29, 2020

(54) ELECTROMAGNETIC ASSEMBLY

(71) Applicant: Siemens Healthcare Limited, Camberley (GB)

(72) Inventors: William James Bickell, Witney (GB); Jonathan Noys, Abingdon (GB); Alun Down, Abingdon (GB)

(73) Assignee: Siemens Healthcare Limited, Camberley (GB)

(*) Notice: Subject to any disclaimer, the term of this patent is extended or adjusted under 35 U.S.C. 154(b) by 302 days.

(21) Appl. No.: 15/934,198

(22) Filed: Mar. 23, 2018

(65) Prior Publication Data
US 2018/0277291 A1 Sep. 27, 2018

(30) Foreign Application Priority Data

Mar. 24, 2017 (GB) .................................. 1704683.0
Jul. 3, 2017 (GB) .................................. 1710640.2

(51) Int. Cl.
| | |
|---|---|
| *H01F 1/00* | (2006.01) |
| *H01F 6/06* | (2006.01) |
| *H01F 7/06* | (2006.01) |
| *G01R 33/3815* | (2006.01) |
| *H01F 6/00* | (2006.01) |

(52) U.S. Cl.
CPC .......... *H01F 6/06* (2013.01); *G01R 33/3815* (2013.01); *H01F 7/06* (2013.01); *H01F 2006/001* (2013.01)

(58) Field of Classification Search
CPC .......... H01H 6/06; H01H 6/0006; H01F 7/06; G01R 33/3815

USPC ......................................................... 335/216
See application file for complete search history.

(56) References Cited

U.S. PATENT DOCUMENTS

| | | | | |
|---|---|---|---|---|
| 4,344,056 A | * | 8/1982 | Kroeger | ................... F16D 51/00 188/138 |
| 5,138,326 A | * | 8/1992 | Edwards | ............ G01R 33/3806 324/319 |
| 5,247,800 A | * | 9/1993 | Mruzek | ................. F25D 19/006 165/185 |

(Continued)

FOREIGN PATENT DOCUMENTS

| | | |
|---|---|---|
| CN | 102870174 A | 1/2013 |
| CN | 203386560 U | 1/2014 |

(Continued)

*Primary Examiner* — Shawki S Ismail
*Assistant Examiner* — Lisa N Homza
(74) *Attorney, Agent, or Firm* — Schiff Hardin LLP (57) ABSTRACT

An electromagnet assembly has an outer shield coil assembly having a first end and a second end, and further has a housing having a first end wall and a second end wall spaced apart from one another by a side wall. The outer shield coil assembly and housing are centered on a common assembly axis. A first support pin extends between and couples the first end wall of the housing and the first end of the outer shield coil assembly. A second support pin extends between and couples the second end wall of the housing and the second end of the outer shield coil assembly. Hence the outer shield coil assembly is carried by the housing by the pins. The coupling of the end walls of the housing and ends of the outer shield coil assembly is configured to prevent relative radial and rotational movement between the outer shield coil assembly and the housing.

15 Claims, 5 Drawing Sheets

(56) References Cited

U.S. PATENT DOCUMENTS

| | | | | |
|---|---|---|---|---|
| 5,323,136 | A | * | 6/1994 | Oue .................... G01R 33/3873 324/318 |
| 5,884,489 | A | * | 3/1999 | Retz .................. G01R 33/3815 335/216 |
| 6,233,814 | B1 | * | 5/2001 | Bast ......................... H01F 5/04 29/602.1 |
| 6,570,475 | B1 | | 5/2003 | Lvovsky et al. |
| 2001/0017581 | A1 | * | 8/2001 | Suda ........................ H01F 7/06 335/299 |
| 2002/0050901 | A1 | * | 5/2002 | Suda .................... F16D 27/112 335/278 |
| 2005/0225418 | A1 | * | 10/2005 | Tran-Ngoc ............... H01F 5/04 336/198 |
| 2006/0028751 | A1 | * | 2/2006 | Takeuchi .............. H02P 25/034 |
| 2006/0226940 | A1 | * | 10/2006 | Lee ........................... H01F 6/00 335/216 |
| 2013/0157865 | A1 | | 6/2013 | Shen et al. |
| 2016/0153492 | A1 | * | 6/2016 | Bauce ................... F04D 29/058 310/90.5 |
| 2016/0178005 | A1 | * | 6/2016 | Bauce ................... F16C 32/048 310/90.5 |
| 2017/0248667 | A1 | | 8/2017 | Calvert et al. |

FOREIGN PATENT DOCUMENTS

| | | |
|---|---|---|
| CN | 103901371 A | 7/2014 |
| JP | 2006141541 A | 6/2006 |
| JP | 2007053241 A | 3/2007 |
| WO | WO-2011/122403 A1 | 10/2011 |

\* cited by examiner

ELECTROMAGNETIC ASSEMBLY

BACKGROUND OF THE INVENTION

Field of the Invention

The present disclosure relates to an electromagnetic assembly, in particular an electromagnet assembly for a superconducting magnet.

Description of the Prior Art

Superconducting magnet structures may have an outer shield coil which bounds a main coil assembly, with structural restraints provided between the outer shield coil and the main coil assembly. This sub assembly may be contained within a housing which, in operation, contains an inert gas as a coolant, for example helium. Hence the housing forms a cryogen vessel, which enables the coil assemblies to be cooled to sufficiently low temperatures to optimize their performance.

The superconducting magnet structures, which are of a precise design and manufactured to within small tolerances, can be subject to significant shock and vibration loads during transport. These loads can cause damage, for example distorting the relative positions of the outer coil and main coil assembly with deleterious effects on their performance during operation.

The material properties of the magnet structure and the cryogen vessel may be significantly different, leading to significantly different rates and extent of thermal contraction and expansion between the coil assemblies and the surrounding housing. This limits the ability to mount the magnet coil assemblies at multiple locations, as doing so would over constrain thermal movement leading to stresses being induced in the assembly, which may lead to distortion, with a consequential loss of performance.

Hence the tendency is to reinforce the structural restraints between the outer shield coil and the main coil assembly. This can result in complex and over engineered solutions which are not required during the operation of the superconducting magnet, and may, because of their mass and geometry, be deleterious to the performance of the superconducting magnet.

Hence a superconducting magnet with a structure that limits the effect of transport loads on the magnet assembly, but is of minimalist design to minimize overall weight of the structure, as well as not interfering with the operation of the magnet, is highly desirable.

SUMMARY OF THE INVENTION

The present invention provides an electromagnet assembly having an outer shield coil assembly having a first end and a second end; a housing having a first end wall and a second end wall spaced apart from one another by a side wall. The outer shield coil assembly and housing are centered on a common assembly axis. The electromagnet assembly further has a first support pin that extends between and couples the first end wall of the housing and the first end of the outer shield coil assembly, and a second support pin that extends between and couples, the second end wall of the housing and the second end of the outer shield coil assembly, such that the outer shield coil assembly is carried by the housing. The coupling of the end walls of the housing and ends of the outer shield coil assembly is configured to prevent relative radial and rotational movement between the outer shield coil assembly and the housing.

The coupling between the outer shield coil assembly and the end walls of the housing may be configured to allow relative axial movement between the outer shield coil assembly and the housing at the first end and second end of the outer shield coil assembly.

Both the first pin and second pin may be provided with a fixing means configured such that the outer shield coil assembly and the end walls of the housing are fixed relative to one another to prevent relative axial movement between the outer shield coil assembly and the housing.

The coupling between the first end of the outer shield coil assembly and the first end wall of the housing may be configured to allow relative axial movement between the first end of the outer shield coil assembly and the housing at the first end of the outer shield coil assembly; and the second pin may be provided with a fixing means configured such that the second end of the outer shield coil assembly and the second end wall of the housing are fixed relative to one another to restrict relative axial movement between the outer shield coil assembly and the housing at the second end of the electromagnet assembly.

The first and second pins may extend from, and be fixed to, the first and second end walls of the housing respectively, and each of the first and second pins may terminate in a free end spaced apart from their respective end wall.

The first end of the outer shield coil assembly may be provided with a first end mounting feature for receiving the first pin; and the second end of the outer shield coil assembly may be provided with a second end mounting feature for receiving the second pin.

The first and second end mounting features may each comprise a support mount which extends from their respective ends of the outer shield coil assembly wherein the support mount of each of the first and second end mounting features is provided with an aperture configured to receive the first and second support pins respectively.

The first and second pin may extend from, and may be fixed to, the first and second ends of the outer shield coil assembly respectively, and each of the first and second pins may terminate in a free end spaced apart from their respective end of the outer shield coil assembly.

The first end wall of the housing may be provided with a first end mounting feature for receiving the first pin; and the second end wall of the housing may be provided with a second end mounting feature for receiving the second pin.

The first and second end mounting feature may comprise a support mount which extends from their respective end walls of the housing wherein the support mount of each of the first and second end mounting features is provided with an aperture configured to receive the first and second support pins respectively.

A biasing member may be provided between at least one of the housing end walls and the outer shield coil assembly to bias the outer shield coil assembly away from the at least one housing end wall.

There may be provided a plurality of first pins for engagement with a corresponding number of first end mounting features; and there are also provided a plurality of second pins for engagement with a corresponding number of second end mounting features.

There may be provided a plurality of first pins spaced around the first end wall of the housing for engagement with a corresponding number of first end mounting features provided on the first end of the outer shield coil assembly; and there may also be provided a plurality of second pins spaced around the second end wall of the housing for engagement with a corresponding number of second end mounting features provided on the second end of the outer shield coil assembly.

There may be provided a plurality of first pins spaced around the first end of the outer shield coil assembly for engagement with a corresponding number of first end mounting features provided on the first end wall of the housing; and there may also be provided a plurality of second pins spaced around the second end of the outer shield coil assembly for engagement with a corresponding number of second end mounting features provided on the second end wall of the housing.

The electromagnet assembly may further have a main coil assembly bounded by the outer shield coil assembly.

The electromagnet assembly may further comprise an inner side wall which extends between the first end wall and a second end wall such that the housing end walls, outer wall and inner wall define a chamber which houses the main coil assembly and the outer shield coil assembly.

The main coil assembly may be mounted on the inner side wall such that the main coil assembly is prevented from moving radially relative to the inner side wall.

Structural restraints may be provided between the outer shield coil assembly and the main coil assembly, to thereby hold the main coil assembly in a substantially fixed position relative to the outer shield coil assembly.

The outer shield coil assembly may comprise a shield coil which extends between the first end and second end of the outer shield coil assembly.

Hence there is provided an electromagnet assembly in which components of the electromagnet are supported at both ends of the assembly structure in such a way to minimize the effect of loads induced on the assembly during transport, as well as assisting in maintaining the relative positions of the elements of the electromagnet assembly during operation.

DESCRIPTION OF THE PREFERRED EMBODIMENTS

Figure 1:
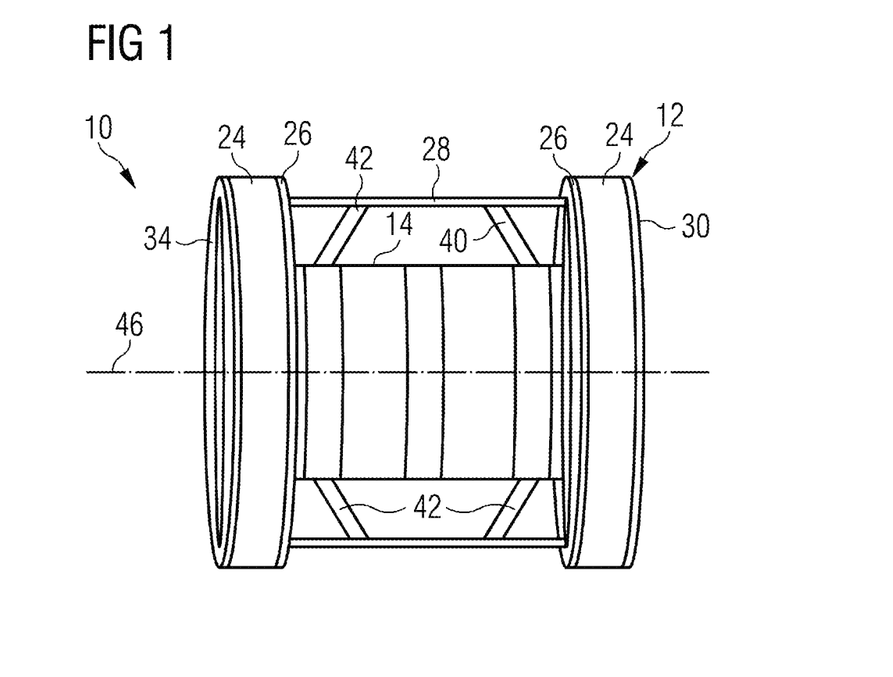
FIG. 1 shows a perspective view of part of an electromagnet assembly of the present disclosure.
Figure 2:
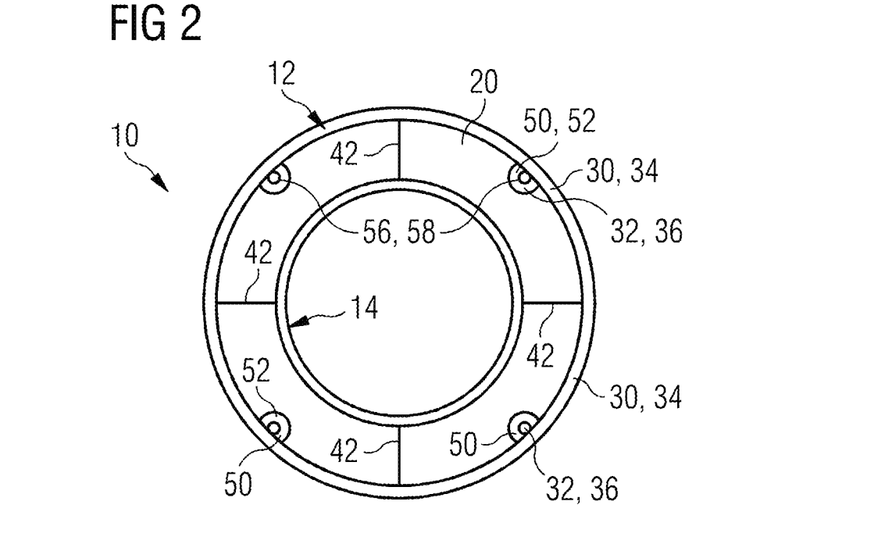
FIG. 2 is an end view of the assembly shown in FIG. 1.

FIG. 1 shows a side view of part of an electromagnet assembly 10 of the present disclosure. FIG. 2 shows an end view of the assembly 10 shown in FIG. 1. The electromagnet assembly 10 may be part of a superconducting magnet. In particular the electromagnet assembly 10 may be part of a superconducting magnet for a Magnetic Resonance Imaging machine (MRI).

As shown in FIGS. 1, 2 the electromagnet assembly 10 comprises an outer shield coil assembly 12 which bounds (i.e. surrounds) a main coil assembly 14.

Figure 3:
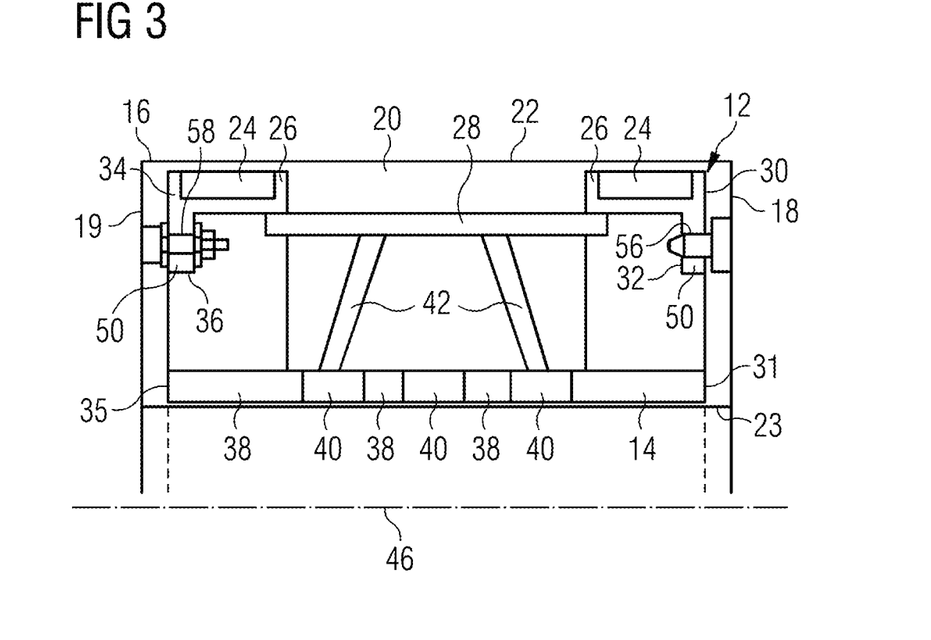
FIG. 3 is a cross-sectional view of the electromagnet assembly shown in FIG. 1.
Figure 4:
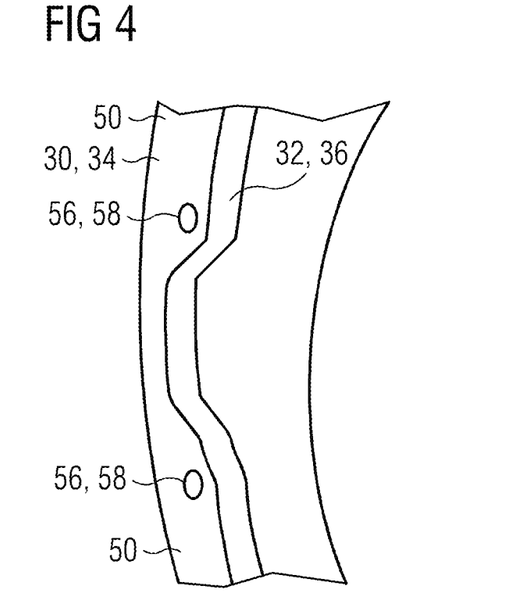
FIG. 4 shows a view of a region of an end of an outer shield coil assembly of the present disclosure.
Figure 8:
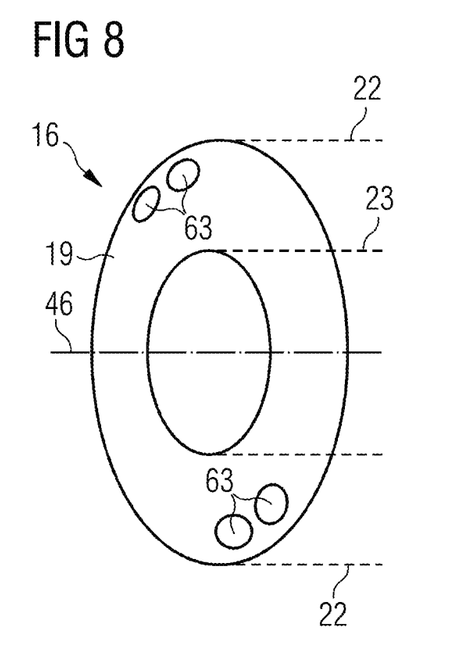
FIGS. 8, 9 show a partially exploded view of end walls on which support pins of the electromagnet assembly of the present disclosure are mounted.
Figure 9:
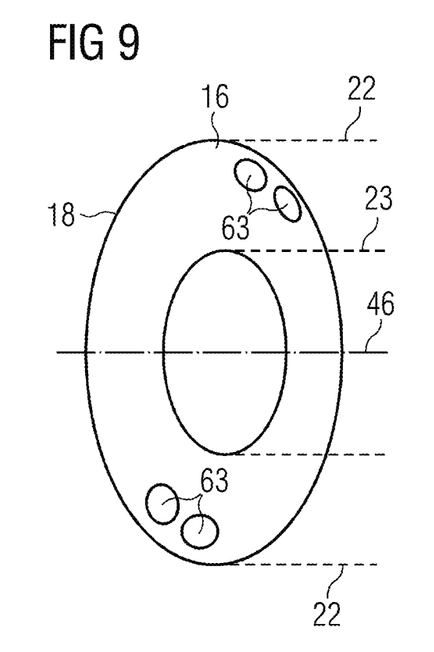

As shown partially in FIGS. 3, 8 and 9, the electromagnetic assembly further has a housing 16. The housing 16 has a first end wall 18 and a second end wall 19 opposite the first end wall 18 spaced apart from one another by an outer side wall 22 which bounds the outer shield coil assembly 12. The outer side wall 22 is cylindrical and extends around the entire circumference of the outer shield coil assembly 12. Additionally there is provided an inner side wall 23 (or "bore tube") which extends between the first end wall 18 and a second end wall 19. The bore tube 23 is cylindrical and extends around, and may be in contact with, an entire inner circumference of the main coil assembly 14. The main coil assembly 14 is thus carried and supported by, and coupled to, the bore tube 23 such that the main coil assembly 14 is slidable relative to the bore tube 23, but is prevented from moving radially relative to the bore tube 23. Put another way, the main coil assembly 14 may be mounted on the inner side wall 23 such that the main coil assembly 14 is prevented from moving radially relative to the inner side wall 23.

Hence the housing 16 comprises the end walls 18, 19, outer wall 22 and inner wall 23, and thus defines and provides a chamber 20 that houses the main coil assembly 14 and the outer shield coil assembly 12. In use the chamber 20 may optionally be filled with a coolant, for example helium, to optimize the performance of the main coil assembly 14 and shield coil assembly 12. Whether or not coolant is provided will, of course, depend on the specification of the electromagnetic assembly.

In the example shown the outer shield coil assembly 12 comprises two shield coils 24, each mounted in a respective journal 26, the journals 26 being connected to main coil assembly 14, spaced apart from one another, by a cage framework 28. In an alternative example, shown in FIG. 13, the outer shield coil assembly 12 has a single shield coil 24 that extends between the first end 30 and second end 34 of the outer shield coil assembly 12. In a further alternative example the outer shield coil assembly may comprise more than two outer shield coils 26. In such an example the outer shield coil may be mounted on a cage/frame akin to that shown in FIG. 1.

The outer shield coil assembly 12 has a first end 30 provided with a first end mounting feature 32 and a second end 34 opposite the first end 30 provided with a second end mounting feature 36.

As shown in FIG. 3, the main coil assembly 14 has a first end 31 and second end 35.

In the example shown both the outer shield coil assembly 12 and main coil assembly 14 are substantially cylindrical.

Structural restraints 42 are provided between the outer shield coil assembly 12 and the main coil assembly 14 to thereby hold the main coil assembly 14 in a substantially fixed position relative to the outer shield coil assembly 12.

In the example shown in FIG. 1, the structural restraints 42 extend radially inwards (with respect to the assembly axis 46) from the cage 28 of the outer coil assembly 12 to the main coil assembly 14.

Figure 13:
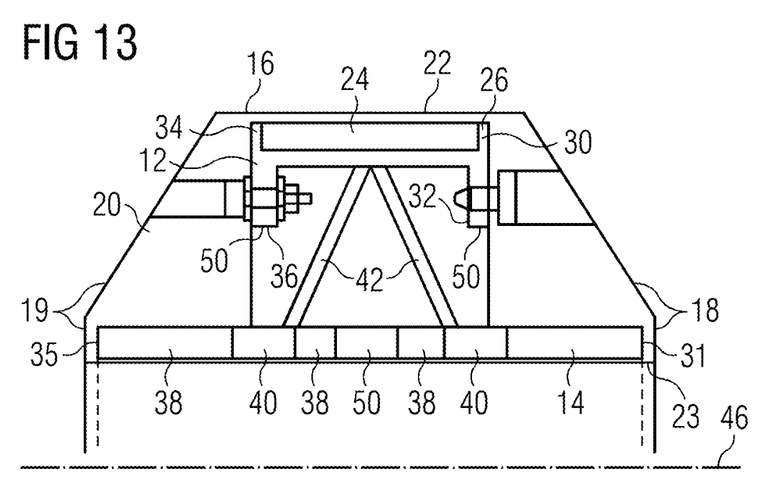
FIG. 13 shows a cross-sectional view of an alternative example of an electromagnet assembly according to the present disclosure.

In an alternative example, as shown in FIG. 13, the structural restraints 42 may instead extend radially inwards (with respect to the assembly axis 46) from the journal 26 of the outer coil assembly 12 to the main coil assembly 14.

The outer shield coil assembly 12 and main coil assembly 14 are concentrically and coaxially aligned and centered on (i.e. co-axial with) an assembly axis 46. The assembly axis 46 extends along the longitudinal length of the assembly 10, between the first end 30 and second end 34 of the outer shield coil assembly 12, and between the first end wall 18 and second end wall 19 of the housing 16.

The structural restraints 42 are required to provide precise positioning of the shield coils 24 relative to the main coil assembly 14, and to provide support of electromagnetic loads, especially in directions in which the housing 16 is not sufficiently stiff. The structural restraints 42 thus provide rotational and axial support of the main coil assembly 14 from the outer shield coil assembly 12.

The structural restraints 42 extend between elements of the cage frame 28 which spaces apart the shield coils 24 and the main coil assembly 14. The structural restraints 42 are spaced around the circumferences of the outer and main coil assemblies 12, 14, as shown in FIG. 2.

The first end wall 18 of the housing 16 is located proximate to the first end 30 of the outer shield coil assembly 12 and second end wall 19 of the housing is located proximate to the second end 34 of the outer shield coil assembly 12.

Figure 14:
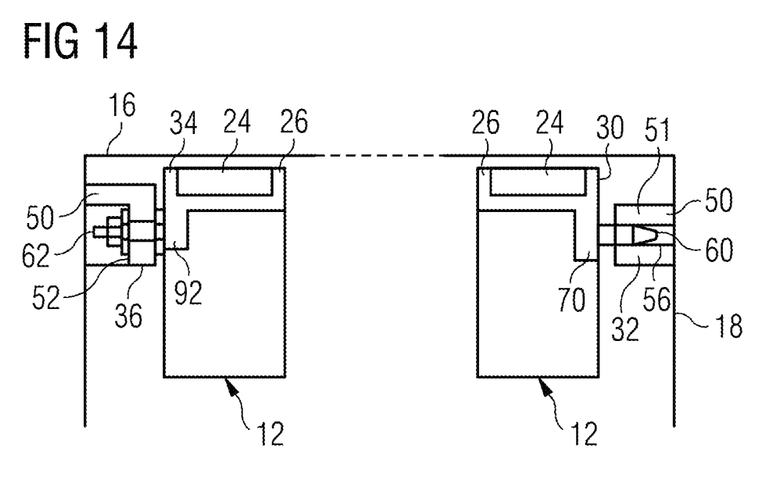
FIG. 14 shows an alternative example of an outer shield coil assembly according to the present disclosure.

As shown in FIGS. 2 to 7, the first and second end mounting features 32, 36 each comprise a support mount 50 (e.g. wall) which extends from the end of their respective ends 30, 34 of the outer shield coil assembly 12. The support mount 50 may be provided as a flange 52, as shown in FIGS. 2 to 7, 14 or as a plate 54 supported from the main body of the outer shield coil assembly 12, or as a boss 51 as shown in FIG. 14. Alternatively the mounting feature 32, 36 may be provided in any other suitable form, for example an aperture or bearing surface provided in or on a side wall of the coil journals 26.

A first support pin 60 (or dowel) extends between and couples the first end wall 18 of the housing 16 and the first end 30 of the outer shield coil assembly 12. That is to say, with reference to the examples shown in FIGS. 5 to 7 and FIG. 13, the first support pin 60 (or dowel) extends between, and engages with, the first end wall 18 of the housing 16 and the first end mounting feature 32 of the outer shield coil assembly 12 to thereby support the outer shield coil assembly 12 on the housing 16.

A second support pin 62 extends between and couples the second end wall 19 of the housing 16 and the second end 34 of the outer shield coil assembly 12. That is to say, with reference to the examples shown in the figures, the second support pin 62 (or "dowel") extends between, and engages with, the second end wall 19 of the housing 16 and the second end mounting feature 36 of the outer shield coil assembly 12, to thereby support the outer shield coil assembly 12 on the housing 16.

In the examples of FIGS. 5 to 7 and FIG. 13 each of the first and second pins terminate in a free end spaced apart from their respective end wall 18, 19. The first pin 60 extends from the first end wall 18 in a first direction, and the second pin 62 extends from the second end wall 19 in a second direction opposite to the first direction. That is to say, the first pin 60 extends from the first end wall 18 of the housing 16 towards the second end wall 19 of the housing 16, and the second pin 62 extends from the second end wall 19 of the housing 16 towards the first end wall 18 of the housing 16.

The support mount (or wall) 50 of each of the first and second end mounting features 32, 36 is provided with an aperture 56, 58 configured to receive the first and second support pins 60, 62 respectively.

At least one of the first pin 60 and first end mounting feature 32, and second pin 62 and second end mounting feature 36, may be engaged (i.e. co-operatively mounted) to permit relative axial movement between the outer shield coil assembly and the housing along the assembly axis 46.

Both of the first pin 60 and first end mounting feature 32, and second pin 62 and second end mounting feature 36 are co-operatively mounted to inhibit (i.e. prevent) relative radial and/or rotational movement between the outer shield coil assembly 12 and the housing 16 relative to (i.e. around) the assembly axis 46.

The first pin 60 and/or second pin 62 are rigidly fixed relative to their respective end walls 18, 19 of the housing 16. The first pin 60 and/or second pin 62 may be welded, riveted or fixed in some other suitable way to their respective end walls 18, 19 of the housing 16.

There may be provided a number of first pins 60 in a series spaced around the first end wall 18 of the housing 16 for engagement with a corresponding number of first end mounting features 32 provided on the first end 30 of the outer shield coil assembly 12. There may also be provided a number of second pins 62 in a series spaced around the second end wall 19 of the housing 16 for engagement with a corresponding number of second end mounting features 36 provided on the second end 34 of the outer shield coil assembly 12. Hence hereafter, although first pin 60 and second pin 62 may be referred to, in each example there may alternatively be provided a plurality of first and/or second pins 60, 62.

The series of first pins 60 and second pins 62 may be equally spaced around the ends of the outer shield coil assembly 12. Alternatively the series of first pins 60 and second pins 62 may be spaced apart by different distances around the ends of the outer shield coil assembly 12. The series of first pins 60 may be located on a common pitch circle diameter (PCD). The second pins 62 may be located on a common pitch circle diameter (PCD).

FIGS. 8, 9 show alternative example locations 63 of the support pins on the end walls 18, 19 of the housing 16. In this example only pairs of first and second pins 60, 62 may be provided on each of the end walls 18, 19, one pair of pins 60, 62 being located adjacent to one another, another pairs of pins 60, 62 being diametrically opposite (that is to say, the two pairs of pins are spaced 180 degrees apart), such that the two pairs of pins are spaced apart from one another around the circumference of the end wall of the housing 16.

There may be provided an equal number of first pins 60 and second pins 62.

Alternatively more first pins 60 may be provided than second pins 62, or fewer first pins 60 may be provided than second pins 62.

Figure 5:
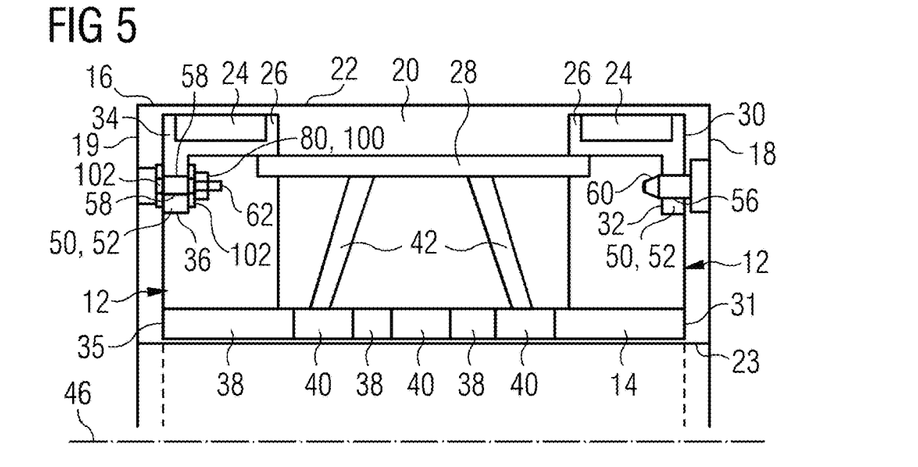
FIG. 5 shows an enlarged view of the ends of the electromagnet assembly shown in FIG. 3.

As shown in the example of FIGS. 3, 5 (where FIG. 5 shows an enlarged view of the ends of the assembly 10), the first pin 60 and its respective mounting feature 32 are configured (for example sized relative to one another) to allow relative axial movement between the first pin 60 and its respective mounting feature 32 at the first end 30 of the outer shield coil assembly 12 along the assembly axis 46. Put another way, the coupling between the first end of the outer shield coil assembly 12 and the first end walls of the housing by the first pin is configured to allow relative axial movement between the first end of the outer shield coil assembly 12 and the housing at the first end of the outer shield coil assembly. That is to say, there may be provided a clearance between the first pin 60 and the aperture 56 of the mounting feature 32 to provide a loose fit so the pin 60 and bearing surface of the mounting feature 32 may move relative to one another (for example slide relative to one another). This permits relative axial movement between the housing 16 and the outer shield coil assembly 12 at the first end of the outer shield coil assembly 12 along the assembly axis 46 but also inhibits (i.e. prevents) relative radial and/or rotational movement between the outer shield coil assembly 12 and the housing 16 relative to the assembly axis 46 since the pin 60 cannot move relative to the mounting feature 32 in a radial direction (with respect to the assembly axis 46) or move relative to the mounting feature 32 in a circumferential direction around the assembly axis 46.

Figure 11:
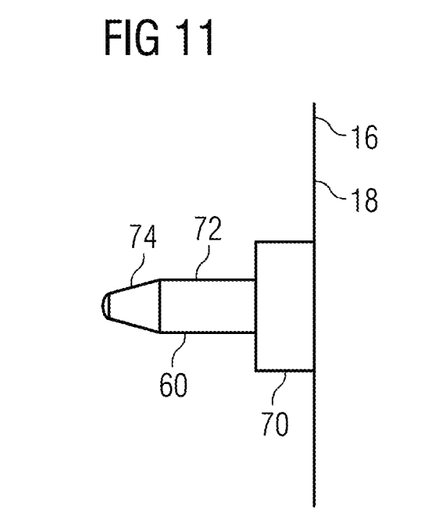
FIG. 11 shows another example of a support pin according to the present disclosure.

As shown in FIG. 11, the first pin 60 may extend from a boss 70 on the end wall 18. A first region 72 extends from the boss 70 and has a first diameter. It may also have a second region 74 which extends from the first region, which tapers to a smaller diameter to provide a lead-in feature. Hence the first pin 60 is configured to provide a loose fit pin feature with an alignment lead-in feature, with the first region 72 providing a bearing surface when the first pin 60 is in position within the aperture 56 of the mounting feature 32. The first pin 60 may be plane/smooth sided.

Thus at the first end 30 the outer shield coil assembly 12 is partially constrained relative to the first end wall 18. The first pin 60 supports the outer shield coil assembly 12 in critical load cases. However, the configuration allows for relative axial movement of the housing 16 and the outer shield coil assembly 12 to relieve any forces due to thermal expansion and contraction and build tolerances.

Figure 10:
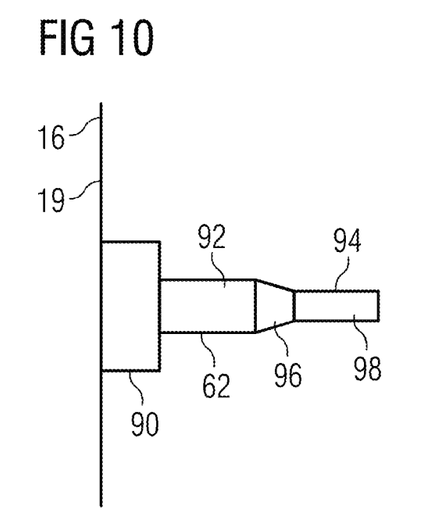
FIG. 10 shows a view of a support pin according to the present disclosure.

As shown in FIG. 10, the second pin 62 of the example of FIGS. 3, 5 may extend from a boss 90 on the end wall 18. A first region 92 extends from the boss 90 and has a first diameter. It may also have a second region 94 which extends from the first region, with a second diameter, less than the first diameter. As shown in FIG. 8, there may be provided a tampered/chamfered transition region 96 between the first region 92 and second region 94. Hence the second region provides a loose fit pin feature with an alignment shoulder provided by the transition region 96, with the first region providing a bearing surface when the second pin 62 is in position within the mounting feature 36. The second region 94 may be provided with a male threaded feature 98 so that a threaded fastener 100 may be provided on the second region 94 to fix the wall (or plate) which defines the mounting feature to the second pin 62 (as shown in FIGS. 3, 5). Alternatively a clip or other suitable fixing may be provided instead of a threaded fastener.

Thus as shown in the example of FIGS. 3, 5 the second pin 62 is provided with a fixing means 80 (for example a threaded fastener 100) to fix the second pin 62 to its respective mounting feature 36 at the second end 34 of the outer shield coil assembly 12. This inhibits relative axial movement between the housing 16 and the outer shield coil assembly 12 at the second end 34 of the outer shield coil assembly 12. Put another way, the second pin is provided with a fixing means 80 configured such that the coupling between the second end 34 of the outer shield coil assembly 12 and the second end wall of the housing by the second pin fixes the second end 34 of the outer shield coil assembly 12 and the second end wall of the housing relative to one another to prevent relative axial movement between the outer shield coil assembly 12 and the housing at the second end of the electromagnet assembly. Additionally the mounting of the second pin 62 in the aperture 58 also inhibits (i.e. prevents) relative radial and/or rotational movement between the outer shield coil assembly 12 and the housing 16 relative to the assembly axis 46 since the pin 62 cannot move relative to the mounting feature 36 in a radial direction (with respect to the assembly axis 46) or move relative to the mounting feature 36 in a circumferential direction around the assembly axis 46.

Figure 6:
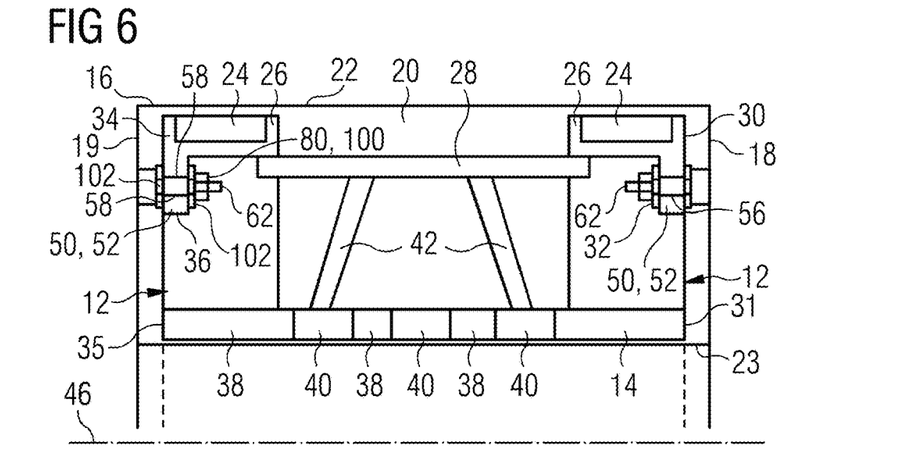
FIGS. 6, 7 show views of alternative examples of ends of the electromagnet assembly of the present disclosure.

As shown in FIGS. 3, 5, 6, a spacer 102 may be provided between the wall/plate which defines the mounting feature 36 and the base (i.e. boss) of the second pin 62. A spacer (for example a washer) 102 may also be provided between the threaded fastener 100 and the wall/plate which defines the mounting feature 36 in the "inner" surface of the second end of the outer coil assembly 12.

The fixing means 80 ensures the outer shield coil assembly 12 is fully constrained to the second end wall 19 of the housing 16, although clearances allow for differential thermal contraction and build tolerances.

Thus in the example of FIGS. 3, 5 the first pin and second pin are of substantially different design, the first pin allowing relative axial movement and the second pin configured to prevent relative axial movement.

In a further example, as shown in FIG. 6, the first pin and second pin 60, 62 are both provided with a retainer 80 to fix the pin 60, 62 to the respective mounting feature 32, 36. The retainer 80 inhibits relative axial movement between the housing 16 and the outer shield coil assembly 12. Put another way, both the first pin and second pin are provided with a retainer 80 configured such that the coupling between the outer shield coil assembly 12 and the end walls of the housing by the first and second pins fix the outer shield coil assembly 12 and the end walls of the housing relative to one another to prevent relative axial movement between the outer shield coil assembly 12 and the housing at both ends of the outer shield coil assembly 12. Thus in this example, the first and second pin(s) are of substantially the same design, having the same design as the second pins 62 of the example shown in FIGS. 3, 5.

In this example, the coil assemblies may be constructed from materials having similar coefficient of thermal expansion to limit differences in thermal expansion and contraction during use. Alternatively or additionally, flexibility or additional clearances may be provided in the design to limit the effects of different rates and extent of thermal expansion and contraction of the housing and coil assemblies.

Figure 7:
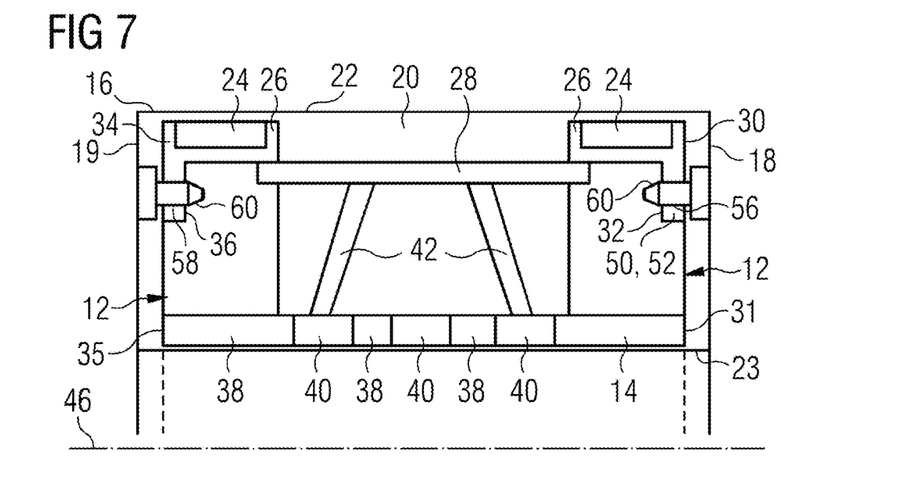

In an alternative example, for example as shown in FIG. 7, the first pin 60 and second pin 60 and their respective mounting feature 32, 36 are configured (that is to say, sized relative to one another) to allow relative axial movement between the pins 60, 62 and their respective mounting feature 32, 36. In this example, this allows relative axial movement between the housing 16 and the outer shield coil assembly 12 along the assembly axis 46. Put another way, the coupling between the outer shield coil assembly 12 and the end walls of the housing by the first and second pins is configured to allow relative axial movement between the outer shield coil assembly 12 and the housing at the first end 30 and second end 34 of the outer shield coil assembly 12. Thus in this example, the first and second pin(s) and mounting features are of substantially the same design, having the same design as the first pins 60 of the example shown in FIGS. 3, 5.

Figure 12:
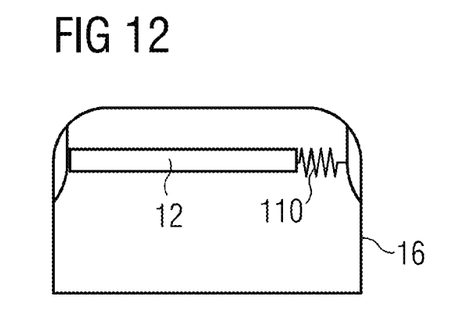
FIG. 12 shows an example of a biasing member included in an example of the electromagnet assembly of the present disclosure.

In the example of FIG. 7, and as illustrated in FIG. 12, a biasing member 110 may be provided between at least one of the housing end walls 18, 19 and the outer shield coil assembly 12 to bias the outer shield coil assembly 12 axially away from the housing end walls 18, 19. In particular, a first biasing member 110 may be provided between the housing first end wall 18 and the outer shield coil assembly 12 and a second biasing member 110 may be provided the housing second end wall 19 and the shield coil assembly 12.

The biasing member 110 may be a spring. A biasing member 110 may be introduced at one or both ends of the housing such that the biasing member(s) are operable to assist with providing support due to differential thermal contraction between the material of the housing 16 and the coil assemblies 12, 14, and may also provide vibration damping.

Alternatively, or additionally in the FIG. 7 example, the outer coil assembly 12 may be held in place between the end walls of the housing by the pins 60, 62 by compression introduced during the build process, either by tooling or weld shrinkage to a predetermined amount.

Thus, in operation, the coupling of the end walls 18, 19 of the housing 16 to the ends of the outer shield coil assembly 12 inhibits relative radial and rotational movement between the outer shield coil assembly 12 and the housing 16 around the assembly axis 46.

Additionally, coupling of the end walls 18, 19 of the housing 16 and ends of the outer shield coil assembly 12 in combination with the coupling of the main coil assembly 14 and the bore tube 23 also prevents relative radial movement between the outer shield coil assembly 12 and the main coil assembly 14.

Different degrees of relative axial movement between the outer shield coil assembly 12 and the housing 16 along the assembly axis 46 are provided by the different examples described above.

The invention of the present disclosure is applicable to other electromagnetic assembly designs. For example whereas in FIG. 1 an outer shield coil assembly 12 is shown with a cage support structure 28 carrying the journals of the coil assemblies, with the mounting features extending from the journals, it may equally be applied to electromagnetic assembly designs having a different structure.

As referred to above, and as shown in FIG. 13, in an alternative example the outer shield coil assembly 12 may comprises a single shield coil 24 which extends between the first end 30 and second end 34 of the outer shield coil assembly 12. Additionally, the outer shield coil assembly 12 may be significantly shorter than the main coil assembly 14. Further the structural restraints 42 may extend radially inwards from the journal 26 of the outer coil assembly 12 to the main coil assembly 14. The housing end walls 18, 19 may thus be formed with angled sections to accommodate the smaller outer shield coil assembly, and the bosses 70, 90 of the support pins 60, 62 may be extended relative to previous examples to provide the necessary support.

Although in the preceding examples shown in the figures the pins, or dowels, extend from the end wall of the housing to be received in mounting features of the outer shield coil assembly, in alternative examples (for example as shown in FIG. 14) the pins or dowels may extend from the outer shield coil assembly to be received in mounting features (for example apertures provided in the housing, or apertures provided in bosses or flanges which extend from the housing, as shown in FIG. 14) provided in/on the end walls of the housing.

Hence the first and second pin 60, 62 may extend from, and be fixed to, the first and second ends 30, 34 of the outer shield coil assembly 12 respectively, and each of the first and second pins 60, 62 may terminate in a free end spaced apart from their respective end 30, 34 of the outer shield coil assembly. The first end wall 18 of the housing may be provided with a first end mounting feature 32 for receiving the first pin 60, and the second end wall 19 of the housing 16 may be provided with a second end mounting feature 36 for receiving the second pin 62. The first and second end mounting feature 32, 36 may have a support mount 50 (which may be provided as a wall, boss or plate) which extends from their respective end walls 18, 19 of the housing 16, wherein the support mount 50 of each of the first and second end mounting features 32, 36 may be provided with an aperture 56, 58 configured to receive the first and second support pins 60 respectively. Alternatively the mounting feature 32, 36 may be provided in any other suitable form, for example an aperture or bearing surface provided in or on a side wall of the coil journals 26.

There is thus provided an arrangement which provides additional support to an electromagnet structure, which may be a superconducting magnet, during transit. Critically it ensures electromagnet shield coils are supported from each end wall of the housing which surrounds them. This limits deflection, hence stresses, under load cases experienced during the magnet's lifetime.

The arrangements of the present disclosure uses otherwise redundant vessel housing structure to provide structural support to the magnetic coils. The provision of support pins in the way described above hence also reduces the loading requirement on support structure struts between the outer shield coils and inner coils, thus enabling partial removal/reduction of support features, for example support struts 42 and/or elements of the cage 28 (in examples where present). This reduces the amount of material required to define the structure, resulting in a lighter assembly.

The additional support provided by the pins 60, 62 permits a magnet support structure with lower stiffness which can absorb differential thermal contraction between inner and outer structure. It also limits deflection of shield coils relative to the inner magnet for critical shock load cases.

Thus the support structure of the electromagnet assembly of the present disclosure balances requirement for load bearing with flexibility to accommodate differential thermal contraction between the coil assemblies and the housing which surrounds them.

As described above with reference to certain embodiments, pins 60, 62 may be load bearing but in other embodiments those pins do not have a load-bearing function. In such embodiments, the pins may be configured to provide positional constraint only, or may also be arranged to act as bump stops under transportation loads, while having no effect in the case of electromagnetic loads. The pins 60, 62 may advantageously be configured to provide such functions when materials of differing thermal contraction rates are used without imparting thermal stresses into the structure.

An advantage of at least some embodiments of the present invention is that the presence of the pins 60, 62 may reduce the need for extra structural elements on the magnet.

The present invention accordingly provides an arrangement for positioning a magnet structure within a containment vessel whilst reducing transportation load transferal into the magnet structure. Such objective may also be achieved with a magnet structure comprising materials that have different thermal contraction characteristics without generating thermal loads between the magnet and containment vessel.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. An electromagnet assembly comprising:
   an outer shield coil assembly having a first end and a second end;
   a housing comprising a first end wall and a second end wall spaced apart from one another by a side wall, the outer shield coil assembly and housing being centered on a common assembly axis;
   a first support pin that extends longitudinally between and couples the first end wall of the housing and the first end of the outer shield coil assembly;
   a second support pin that extends longitudinally between and couples the second end wall of the housing and the second end of the outer shield coil assembly such that the outer shield coil assembly is carried by the housing; and
   the coupling of the end walls of the housing and ends of the outer shield coil assembly being configured to prevent relative radial and rotational movement between the outer shield coil assembly and the housing.

2. An electromagnet assembly as claimed in claim 1 wherein the coupling between the outer shield coil assembly and the end walls of the housing are configured to allow relative axial movement between the outer shield coil assembly and the housing at the first end and second end of the outer shield coil assembly.

3. An electromagnet assembly as claimed in claim 1 wherein each of the first pin and second pin has a retainer that fixes the outer shield coil assembly and the end walls of the housing relative to each another to prevent relative axial movement between the outer shield coil assembly and the housing.

4. An electromagnet assembly as claimed in claim 1 wherein:
   the coupling between the first end of the outer shield coil assembly and the first end wall of the housing is configured to allow relative axial movement between the first end of the outer shield coil assembly and the housing at the first end of the outer shield coil assembly; and
   the second pin has a retainer that fixes the second end of the outer shield coil assembly and the second end wall of the housing relative to each another to restrict relative axial movement between the outer shield coil assembly and the housing at the second end of the electromagnet assembly.

5. An electromagnet assembly as claimed in claim 1 wherein the first and second pins extend from, and are fixed to, the first and second end walls of the housing respectively, and each of the first and second pins terminate in a free end spaced apart from their respective end wall.

6. An electromagnet assembly as claimed in claim 1 wherein:
   the first end of the outer shield coil assembly has a first end mounting feature that receives the first pin; and
   the second end of the outer shield coil assembly has a second end mounting feature that receives the second pin.

7. An electromagnet assembly as claimed in claim 1 wherein the first and second pin extend from, and are fixed to, the first and second ends of the outer shield coil assembly, respectively, and each of the first and second pins terminates in a free end spaced apart from the respective end of the outer shield coil assembly.

8. An electromagnet assembly as claimed in claim 7 comprising a plurality of first pins for engagement with a corresponding number of first end mounting features, and a plurality of second pins for engagement with a corresponding number of second end mounting features.

9. An electromagnet assembly as claimed in claim 1 wherein:
   the first end wall of the housing has a first end mounting feature that receives the first pin; and
   the second end wall of the housing has a second end mounting feature that receives the second pin.

10. An electromagnet assembly as claimed in claim 1 comprising a biasing member between at least one of the housing end walls and the outer shield coil assembly, to bias the outer shield coil assembly away from the at least one housing end wall.

11. An electromagnet assembly as claimed in claim 1 further comprising:
    a main coil assembly bounded by the outer shield coil assembly.

12. An electromagnet assembly as claimed in claim 11 further comprising:
    an inner side wall that extends between the first end wall and a second end wall, such that the housing end walls, outer wall and inner wall define a chamber which houses the main coil assembly and the outer shield coil assembly.

13. An electromagnet assembly as claimed in claim 12 wherein the main coil assembly is mounted on the inner side wall such that the main coil assembly is prevented from moving radially relative to the inner side wall.

14. An electromagnet assembly as claimed in claim 11 comprising structural restraints between the outer shield coil assembly and the main coil assembly that hold the main coil assembly in a substantially fixed position relative to the outer shield coil assembly.

15. An electromagnet assembly as claimed in claim 1 wherein the outer shield coil assembly comprises a shield coil that extends between the first end and second end of the outer shield coil assembly.

* * * * *